(12) United States Patent
Choi et al.

(10) Patent No.: US 8,917,569 B2
(45) Date of Patent: *Dec. 23, 2014

(54) SEMICONDUCTOR APPARATUS TRANSMITTING FUSE INFORMATION AND REPAIR METHOD THEREOF

(75) Inventors: Min Seok Choi, Ichon-shi (KR); Jong Chern Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 411 days.

This patent is subject to a terminal disclaimer.

(21) Appl. No.: 13/168,241

(22) Filed: Jun. 24, 2011

(65) Prior Publication Data

US 2012/0194243 A1 Aug. 2, 2012

(30) Foreign Application Priority Data

Jan. 31, 2011 (KR) .......................... 10-2011-0009808

(51) Int. Cl.
*G11C 7/00* (2006.01)
*G11C 17/18* (2006.01)

(52) U.S. Cl.
USPC ........................................ 365/225.7; 365/200

(58) Field of Classification Search
CPC ........... H01L 2225/06541; H01L 2225/06544; H01L 2225/06548; G11C 17/14; G11C 17/143; G11C 17/146; G11C 17/16; G11C 17/165; G11C 29/027; G11C 2229/763
USPC .......................................... 365/96, 225.7, 200
See application file for complete search history.

(56) References Cited

U.S. PATENT DOCUMENTS

| | | | |
|---|---|---|---|
| 7,849,237 B2 | 12/2010 | Nonomura et al. | |
| 8,110,892 B2 * | 2/2012 | Lee et al. | 257/529 |
| 2009/0213634 A1 * | 8/2009 | Shibata | 365/51 |
| 2012/0194228 A1 * | 8/2012 | Choi | 327/117 |
| 2012/0212990 A1 * | 8/2012 | Park et al. | 365/63 |

FOREIGN PATENT DOCUMENTS

| KR | 1020020044055 A | 6/2002 |
|---|---|---|
| KR | 1020110005390 A | 1/2011 |

* cited by examiner

*Primary Examiner* — Vanthu Nguyen
*Assistant Examiner* — Khamdan Alrobaie
(74) *Attorney, Agent, or Firm* — William Park & Associates Patent Ltd.

(57) ABSTRACT

A semiconductor apparatus includes a signal transmission block and signal reception blocks. The signal transmission block is disposed in a first chip and configured to transmit fuse information in synchronization with transmission control signals. The signal reception blocks are respectively disposed in the first chip and a second chip and configured to receive the fuse information in synchronization with reception control signals.

40 Claims, 14 Drawing Sheets

SEMICONDUCTOR APPARATUS TRANSMITTING FUSE INFORMATION AND REPAIR METHOD THEREOF

CROSS-REFERENCES TO RELATED APPLICATION

The present application claims priority under 35 U.S.C. §119(a) to Korean Patent Application No. 10-2011-0009808, filed on Jan. 31, 2011, in the Korean Intellectual Property Office, which is incorporated herein by reference in its entirety as if set forth in full.

BACKGROUND

1. Technical Field

Various embodiments of the present invention relates to a semiconductor memory apparatuses and related methods. In particular, certain embodiments relate to a three-dimensional (3D) semiconductor apparatus in which a plurality of chips are stacked.

2. Related Art

In order to elevate the degree of integration of a semiconductor apparatus, a three-dimensional semiconductor apparatus has been developed in which a plurality of chips are stacked and packaged. Since two or more chips are vertically stacked, the 3D semiconductor apparatus can achieve a maximum degree of integration in the same space.

Various schemes exist to realize the three-dimensional semiconductor apparatus. In one scheme, a plurality of chips with the same structure are stacked and the stacked chips are coupled to one another using wires, such as metal lines, so that they operate as a single semiconductor apparatus.

Also, recently, a through-silicon via (TSV) type semiconductor apparatus has been disclosed in the art, in which silicon vias are formed through a plurality of stacked chips so that all the chips are electrically connected to one another. In the TSV type semiconductor apparatus, since the chips are electrically connected to one another through the silicon vias vertically passing through the chips, it is possible to efficiently reduce the area of the package, as compared with a semiconductor apparatus in which respective chips are electrically connected to one another through bonding wirings bonded adjacent to the edges of the chips.

The number of TSVs for connecting the plurality of chips gradually increases. Therefore, in step with the increase in the number of TSVs, a technology for replacing defective TSVs with normal TSVs is needed. This can be accomplished using fuse information, such as a fuse circuit for storing information as to whether TSVs are normal or defective. In the case where the fuse circuit is disposed in each of the stacked chips, while the problem of replacing defective TSVs can be solved, an inefficiency may result in terms of the chip area.

SUMMARY

Accordingly, there is a need for an improved semiconductor apparatus which is capable of transmitting fuse information to a plurality of chips constituting a single semiconductor apparatus.

To attain the advantages and in accordance with the purposes of the invention, as embodied and broadly described herein, one exemplary aspect of the present invention may provide a semiconductor apparatus, in which first and second chips are stacked, that includes: a signal transmission block disposed in the first chip and configured to transmit fuse information in synchronization with transmission control signals; and signal reception blocks disposed in the first and second chips, and configured to receive the fuse information in synchronization with reception control signals, wherein the transmission control signals and the reception control signals have substantially the same phases.

In another exemplary aspect of the present invention, a semiconductor apparatus may include: a signal transmission block configured to transmit fuse information in response to transmission control signals; a master chip signal reception block disposed in a master chip and configured to receive the fuse information in response to reception control signals and generate TSV selection signals; a slave chip signal reception block disposed in a slave chip and configured to receive the fuse information in response to the reception control signals and generate the TSV selection signals; and a repair circuit configured to set paths of signals to be transmitted from the master chip to the slave chip, in response to the TSV selection signals.

In still another exemplary aspect of the present invention, a method for repairing a semiconductor apparatus may include: receiving a clock signal and generating transmission control signals and reception control signals; transmitting fuse information from a master chip in response to the transmission control signals; receiving the fuse information in response to the reception control signals in the master chip and a slave chip; and selecting a TSV for transmitting a signal from the master chip to the slave chip, in response to the fuse information.

In still another exemplary aspect of the present invention, a method for repairing a semiconductor apparatus may include: receiving a clock signal and generating transmission control signals and reception control signals; generating output enable signals which are enabled with a preset time interval, from the transmission control signals; transmitting fuse information from a master chip in response to the output enable signals; and receiving the fuse information by the master chip and a slave chip in response to the reception control signals.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
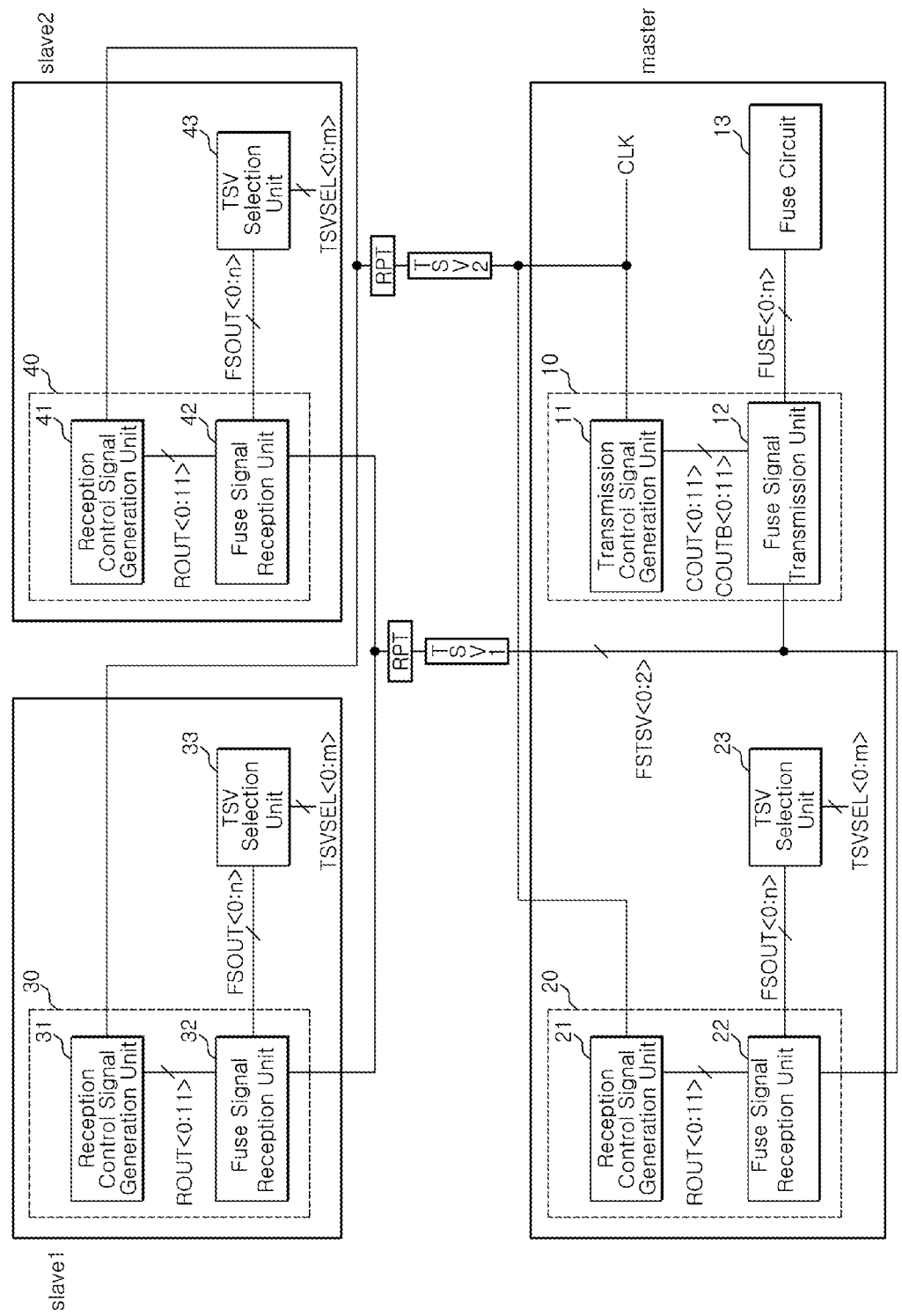
FIG. 1 is a block diagram schematically illustrating the configuration of a semiconductor apparatus in accordance with an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram schematically illustrating the configuration of a semiconductor apparatus in accordance with an embodiment of the present invention. In FIG. 1, a semiconductor apparatus 1 is illustrated as including a master chip master and first and second slave chips slave1 and slave2. However, the number of stacked chips is not specifically limited. Since the master chip master and slave chips slave1 and slave2 are packaged in a state in which they are stacked upon one another, they constitute a single semiconductor apparatus and are electrically connected with one another through through-silicon vias (TSVs).

In FIG. 1, the master chip master includes a signal transmission block 10. Signal transmission block 10 is configured to transmit fuse information in response to transmission control signals COUT<0:11> and COUTB<0:11>. The fuse information is fuse signals FUSE<0:n>, which are generated in fuse circuit 13, including a plurality of fuse sets depending upon whether or not respective fuses are cut, and may include all information signals that may be used in a semiconductor apparatus. In the embodiment of the present invention, the fuse information is specifically exemplified as having information as to whether or not a defective TSV exists and as to the defective TSV. The signal transmission block 10 outputs the fuse signals FUSE<0:n> in synchronization with the transmission control signals COUT<0:11> and COUTB<0:11>.

The signal transmission block 10 includes a transmission control signal generation unit 11 and a fuse signal transmission unit 12. The transmission control signal generation unit 11 is configured to generate the transmission control signals COUT<0:11> and COUTB<0:11> in response to a clock signal CLK. The fuse signal transmission unit 12 is configured to receive the fuse signals FUSE<0:n> and output the fuse signals FUSE<0:n> as fuse transmission signals FSTSV<0:2> in synchronization with the transmission control signals COUT<0:11> and COUTB<0:11>. The outputted fuse transmission signals FSTSV<0:2> may be transmitted to one or more of the master chip master and the first and second slave chips slave1 and slave2 by not passing through a first TSV TSV1 or by passing through the first TSV TSV1.

The master chip master and the first and second slave chips slave1 and slave2 include signal reception blocks 20, 30 and 40, respectively. The signal reception blocks 20, 30 and 40 are configured to receive the fuse information transmitted from the signal transmission block 10. The signal reception blocks 20, 30 and 40 receive the fuse information in response to reception control signals ROUT<0:11>. That is to say, the signal reception blocks 20, 30 and receive the fuse transmission signals FSTSV<0:2> in synchronization with the reception control signals ROUT<0:11>. The signal reception blocks 20, 30 and 40 generate fuse output signals FSOUT<0:n> according to the received fuse transmission signals FSTSV<0:2>.

The signal reception blocks 20, 30 and 40 include reception control signal generation units 21, 31 and 41 and fuse signal reception units 22, 32 and 42. The reception control signal generation units 21, 31 and 41 are configured to generate the reception control signals ROUT<0:11> in response to the clock signal CLK. In the embodiment of the present invention, the reception control signals ROUT<0:11> are signals that have substantially the same phases as the transmission control signals COUT<0:11>. Accordingly, the reception control signal generation units 21, 31 and 41 may be configured in the same manner as the transmission control signal generation unit 11. The fuse signal reception units 22, 32 and 42 are configured to receive the fuse transmission signals FSTSV<0:2> in response to the reception control signals ROUT<0:11> and generate fuse output signals FSOUT<0:n>. That is to say, the fuse signal reception units 22, 32 and 42 are configured to generate the fuse output signals FSOUT<0:n> from the fuse transmission signals FSTSV<0:2> in synchronization with the reception control signals ROUT<0:11>. As described above, since the transmission control signals COUT<0:11> generated from the transmission control signal generation unit 11 have the same phase as the reception control signals ROUT<0:11> generated from the reception control signal generation units 21, 31 and 41, the master chip master and the first and second slave chips slave1 and slave2 may receive the fuse transmission signals FSTSV<0:2> at a timing at which the fuse transmission signals FSTSV<0:2> are transmitted from the signal transmission block 10. In other words, as the signal transmission block 10 outputs the fuse transmission signals FSTSV<0:2> in synchronization with the transmission control signals COUT<0:11> and COUTB<0:11>, the signal reception blocks 20, 30 and 40 may receive the fuse transmission signals FSTSV<0:2> in synchronization with the reception control signals ROUT<0:11> and generate the fuse output signals FSOUT<0:n>. Accordingly, the fuse information of the fuse circuit 13 may be transmitted to the signal reception blocks 20, 30 and 40.

The fuse transmission signals FSTSV<0:2> may be transmitted to the first and second slave chips slave1 and slave2 through the first TSV TSV1. Further, the fuse transmission signals FSTSV<0:2> may be transmitted to the signal reception block 20 of the master chip master through a signal line by not passing through the first TSV TSV1. The semiconductor apparatus 1 further includes a second TSV TSV2 for transmitting the clock signal CLK. The second TSV TSV2 is connected through the master chip master and the first and second slave chips slave1 and slave2 and may transmit the clock signal CLK to the respective chips. Although the cycle of the clock signal CLK is not specifically limited, the clock signal CLK may have a cycle longer than an external clock signal received by the semiconductor apparatus 1. The clock signal CLK, which has a longer cycle than the external clock signal, may be generated through a clock divider (not shown), etc. In this way, in the case where the clock signal CLK with the longer cycle than the external clock signal is used, since a sufficient time margin for transmitting and receiving the fuse signals FUSE<0:n> may be secured, more precise and smooth signal transmission is enabled.

In FIG. 1, the semiconductor apparatus 1 may further include repeaters RPT for respectively buffering the fuse transmission signals FSTSV<0:2> and the clock signal CLK transmitted through the first TSV TSV1 and the second TSV TSV2.

In FIG. 1, the master chip master and the first and second slave chips slave1 and slave2 of the semiconductor apparatus 1 may further include TSV selection units 23, 33 and 43, each for receiving the fuse output signals FSOUT<0:n> and generating TSV selection signals TSVSEL<0:m>. The TSV selection units 23, 33 and 44 are configured to decode the fuse output signals FSOUT<0:n> and generate the TSV selection signals TSVSEL<0:m>. As described above, in the embodiment of the present invention, the fuse information is exemplified as having defect information of the TSVs. Thus, the TSV selection units 23, 33 and 43 may be used for repair operations for replacing defective TSVs with normal TSVs.

Figure 2:
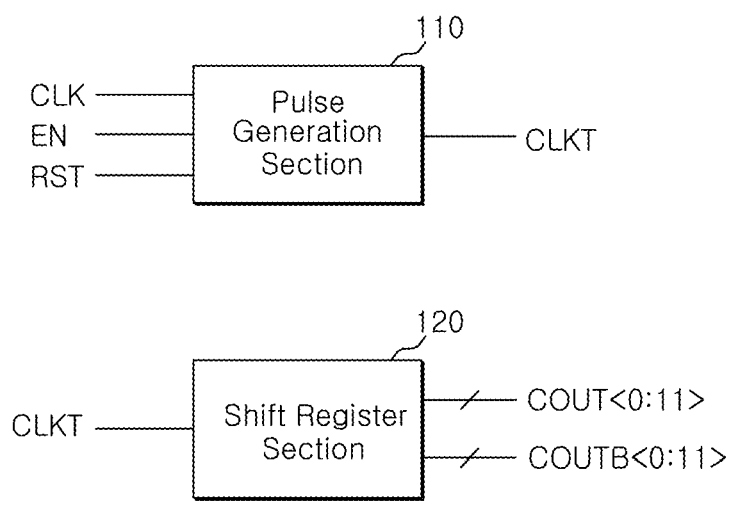
FIG. 2 is a block diagram schematically illustrating the configuration of an exemplary embodiment of a transmission control signal generation unit shown in FIG. 1.

FIG. 2 is a block diagram schematically illustrating the configuration of an exemplary embodiment of the transmission control signal generation unit shown in FIG. 1. In FIG. 2, the transmission control signal generation unit 11 includes a pulse generation section 110 and a shift register section 120. The pulse generation section 110 is configured to receive the clock signal CLK and generate a pulse signal CLKT. The pulse generation section 110 generates the pulse signal CLKT from the clock signal CLK when an enable signal EN is enabled. For example, the pulse signal CLKT may be generated by an AND operation of the clock signal CLK and the enable signal EN. The enable signal EN may include any one from among signals generally used in a semiconductor apparatus. A power-up signal of a semiconductor apparatus, an MRS signal generated from a mode register set, and the like may be used as the enable signal EN. Also, the pulse generation section 110 may be initialized when receiving a reset signal RST.

The shift register section 120 is configured to receive the pulse signal CLKT and generate the transmission control signals COUT<0:11> and COUTB<0:11>. The shift register section 120 may sequentially delay the pulse signal CLKT by a predetermined time in response to the clock signal CLK and generate the transmission control signals COUT<0:11> and COUTB<0:11>, which are sequentially enabled from the sequentially delayed signals.

Figure 3:
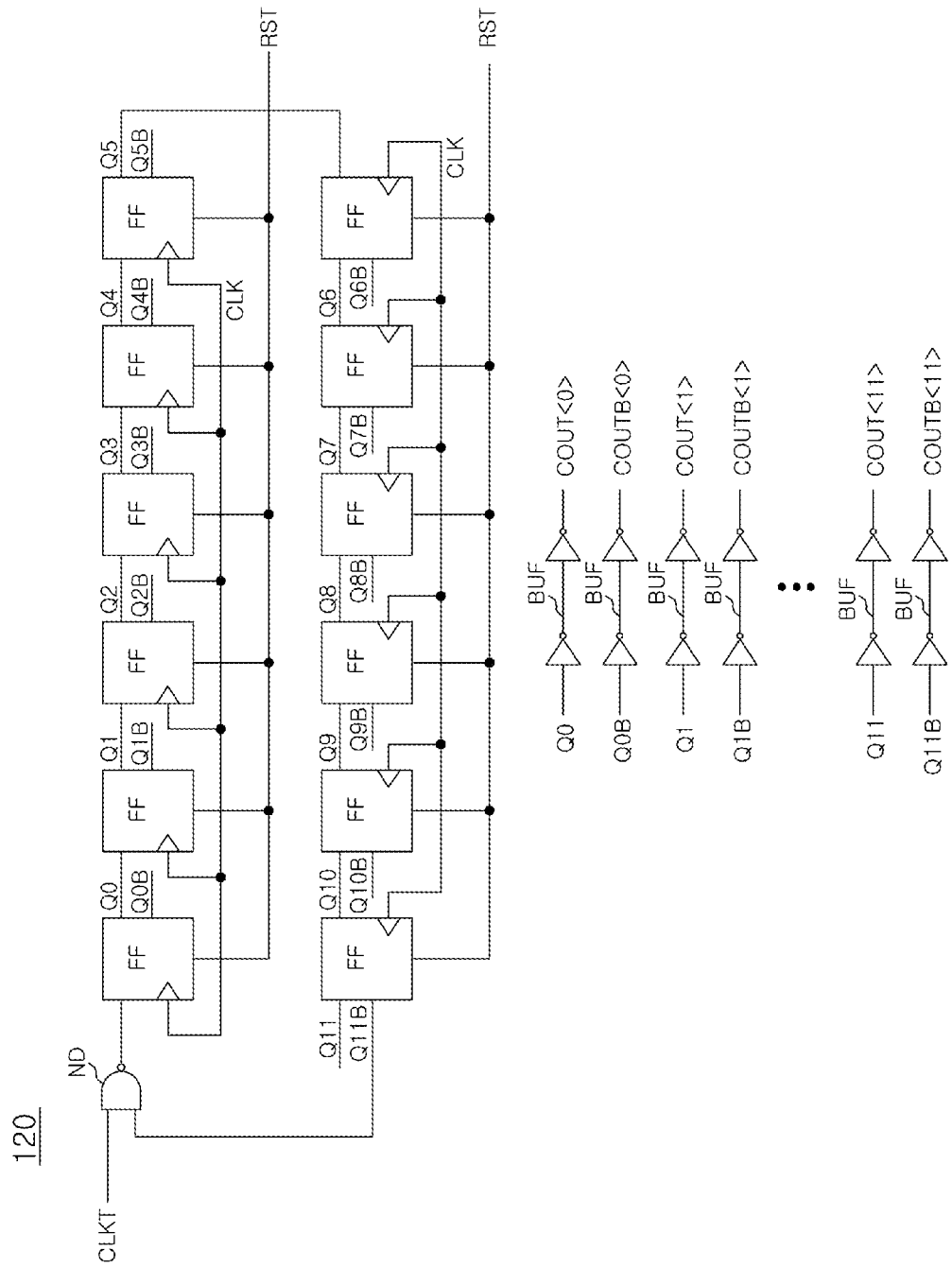
FIG. 3 is a circuit diagram schematically illustrating the configuration of an exemplary embodiment of a shift register section shown in FIG. 2.

FIG. 3 is a circuit diagram schematically illustrating the configuration of an exemplary embodiment of the shift register section shown in FIG. 2. In FIG. 3, the shift register section 120 includes a plurality of flip-flops FF and a plurality of buffer parts BUF. The plurality of flip-flops FF receive signals in response to the clock signal CLK, delay the received signals by the predetermined time, for example, one cycle of the clock signal CLK, and output resultant signals. The plurality of flip-flops FF are sequentially connected in series, and in FIG. 3, twelve flip-flops are shown exemplarily. The shift register section 120 may further include a NAND gate ND. The NAND gate ND receives the pulse signal CLKT and an output Q11B of the flip-flop FF, which is connected at the last stage among the flip-flops FF connected in series. In this case, the NAND gate ND and the twelve flip-flops FF define a chain form, and unless the reset signal RST is not inputted, the plurality of transmission control signals COUT<0:11> and COUTB<0:11> may be consecutively generated with the input of one pulse signal CLKT.

The buffer parts BUF may be provided by the number of flip-flops FF or more. The respective buffer parts BUF receive outputs Q0 to Q11 of the plurality of flip-flops FF and inverted signals Q0B to Q11B of the outputs Q0 to Q11, buffer the received signals Q0 to Q11 and Q0B to Q11B, and generate the transmission control signals COUT<0:11> and COUTB<0:11>.

The reception control signal generation units 21, 31 and 41, which are respectively disposed in the master chip master and the first and second slave chips slave1 and slave2, have the same configuration as the transmission control signal generation unit 11 shown in FIGS. 2 and 3. Therefore, the reception control signal generation units 21, 31 and 41 may generate the reception control signals ROUT<0:11>, which have substantially the same phase as the transmission control signals COUT<0:11> and COUTB<0:11>.

Figure 4:
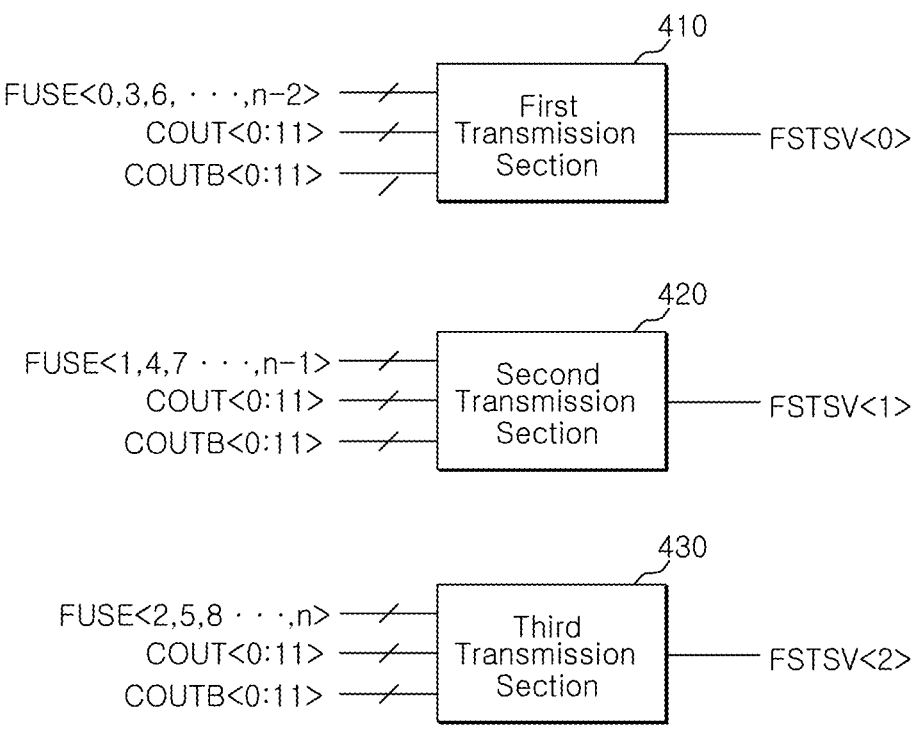
FIG. 4 is a block diagram schematically illustrating the configuration of an exemplary embodiment of a fuse signal transmission unit shown in FIG. 1.

FIG. 4 is a block diagram schematically illustrating the configuration of an exemplary embodiment of the fuse signal transmission unit shown in FIG. 1. In FIG. 4, the fuse signal transmission unit 12 includes first to third transmission sections 410, 420 and 430. The first to third transmission sections 410, 420 and 430 commonly receive the transmission control signals COUT<0:11> and COUTB<0:11>. The first transmission section 410 is configured to receive a portion FUSE<0, 3, 6, . . . , n−2> from among the fuse signals FUSE<0:n>, the second transmission section 420 is configured to receive another portion FUSE<1, 4, 7, . . . , n−1> from among the fuse signals FUSE<0:n>, and the third transmission section 430 is configured to receive a remaining portion FUSE<2, 5, 8, . . . , n> from among the fuse signals FUSE<0:n>. Namely, the fuse signals FUSE<0:n>, which are received by the respective first to third transmission sections 410, 420 and 430, do not overlap with one another. Accordingly, the fuse signal transmission unit 12 may transmit a plurality of fuse signals FUSE<0:n> in response to one of the transmission control signals COUT<0:11> and COUTB<0:11>. That is to say, if the transmission control signals COUT<0> and COUTB<0> are enabled, the first transmission section 410 generates the fuse transmission signal FSTSV<0> from the fuse signal FUSE<0> and outputs the generated fuse transmission signal FSTSV<0>, the second transmission section 420 generates the fuse transmission signal FSTSV<1> from the fuse signal FUSE<1> and outputs the generated fuse transmission signal FSTSV<1>, and the third transmission section 430 generates the fuse transmission signal FSTSV<2> from the fuse signal FUSE<2> and outputs the generated fuse transmission signal FSTSV<2>. If the transmission control signals COUT<1> and COUTB<1> are enabled, the first transmission section 410 generates the fuse transmission signal FSTSV<0> from the fuse signal FUSE<3> and outputs the generated fuse transmission signal FSTSV<0>, the second transmission section 420 generates the fuse transmission signal FSTSV<1> from the fuse signal FUSE<4> and outputs the generated fuse transmission signal FSTSV<1>, and the third transmission section 430 generates the fuse transmission signal FSTSV<2> from the fuse signal FUSE<5> and outputs the generated fuse transmission signal FSTSV<2>. Accordingly, the fuse signal transmission unit 12 receives the fuse signals FUSE<0:n> inputted in parallel and outputs the fuse transmission signals FSTSV<0:2> in series. The fuse signal transmission unit 12, including the first to third transmission sections 410, 420 and 430, can transmit thirty six fuse signals in response to twelve transmission control signals COUT<0:11> and the twelve inverted signals COUTB<0:11> thereof. However, the number of fuse signals is not limited, and a person skilled in the art will readily appreciate that the number of fuse signals to be transmitted may be adjusted depending upon the number of transmission sections and the number of transmission control signals.

Figure 5:
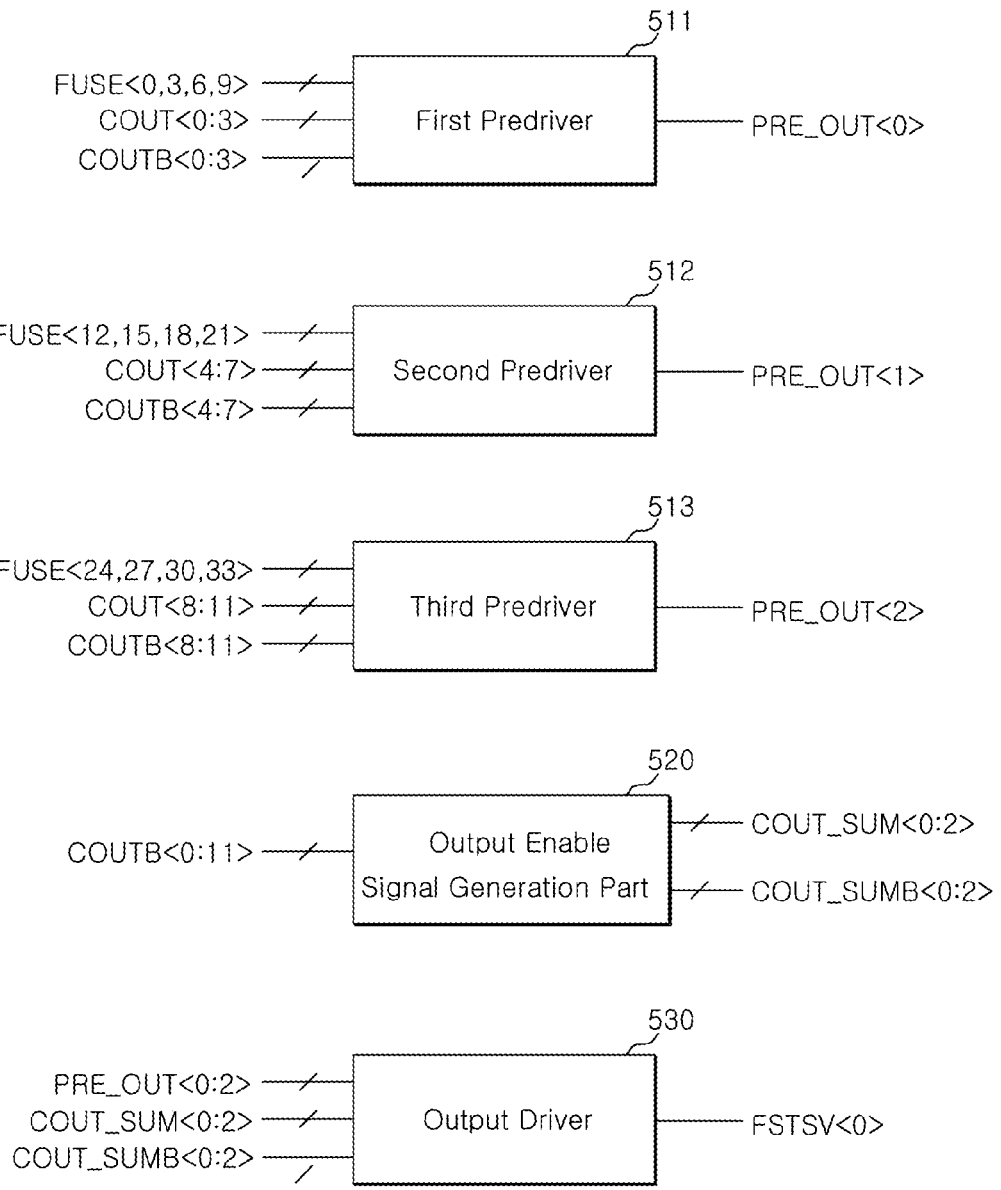
FIG. 5 is a block diagram schematically illustrating the configuration of an exemplary embodiment of a first transmission section shown in FIG. 4.

FIG. 5 is a block diagram schematically illustrating the configuration of an exemplary embodiment of the first transmission section shown in FIG. 4. The first transmission section 410 includes first to third predrivers 511 to 513, an output enable signal generation part 520, and an output driver 530. The first to third predrivers 511 to 513 receive assigned fuse signals FUSE<0, 3, 6, 9>, FUSE<12, 15, 18, 21> and FUSE<24, 27, 30, 33>, (when assuming that total numbers of the fuse signals FUSE<0:n> are thirty-six), and receive assigned transmission control signals COUT<0:3> and COUTB<0:3>, COUT<4:7> and COUTB<4:7>, and COUT<8:11> and COUTB<8:11>, respectively. The first to third predrivers 511 to 513 generate first to third driving fuse signals PRE_OUT<0:2> from the assigned fuse signals FUSE<0, 3, 6, 9>, FUSE<12, 15, 18, 21> and FUSE<24, 27, 30, 33> in response to the assigned transmission control signals COUT<0:3> and COUTB<0:3>, COUT<4:7> and COUTB<4:7>, and COUT<8:11> and COUTB<8:11>, and output the generated first to third driving fuse signals PRE_OUT<0:2>. The first to third driving fuse signals PRE_OUT<0:2> are outputted through the output driver 530. The output enable signal generation part 520 solves the problem where the first to third driving fuse signals PRE_OUT<0:2> generated from the first to third predrivers 511 to 513 collide with one another.

The output enable signal generation part 520 receives the transmission control signals COUTB<0:11> and generates output enable signals COUT_SUM<0:2> and COUT_SUMB<0:2>. The output enable signal generation part 520 generates first output enable signals COUT_SUM<0> and COUT_SUMB<0> from the transmission control signals COUTB<0:3>, generates second output enable signals COUT_SUM<1> and COUT_SUMB<1> from the transmission control signals COUTB<4:7>, and generates third output enable signals COUT_SUM<2> and COUT_SUMB<2> from the transmission control signals COUTB<8:11>. The first output enable signals COUT_SUM<0> and COUT_SUMB<0> are consecutively enabled while the transmission control signals COUTB<0:3> are enabled, the second output enable signals COUT_SUM<1> and COUT_SUMB<1> are consecutively enabled while the transmission control signals COUTB<4:7> are enabled, and the third output enable signals COUT_SUM<2> and COUT_SUMB<2> are consecutively enabled while the transmission control signals COUTB<8:11> are enabled.

The output driver 530 receives the first to third driving fuse signals PRE_OUT<0:2> and generates the fuse transmission signal FSTSV<0> in response to the first to third output enable signals COUT_SUM<0:2> and COUT_SUMB<0:2>. The output driver 530 generates the fuse transmission signal FSTSV<0> from the first driving fuse signal PRE_OUT<0> in response to the first output enable signals COUT_SUM<0> and COUT_SUMB<0>, generates the fuse transmission signal FSTSV<0> from the second driving fuse signal PRE_OUT<1> in response to the second output enable signals COUT_SUM<1> and COUT_SUMB<1>, and generates the fuse transmission signal FSTSV<0> from the third driving fuse signal PRE_OUT<2> in response to the third output enable signals COUT_SUM<2> and COUT_SUMB<2>.

Figure 6:
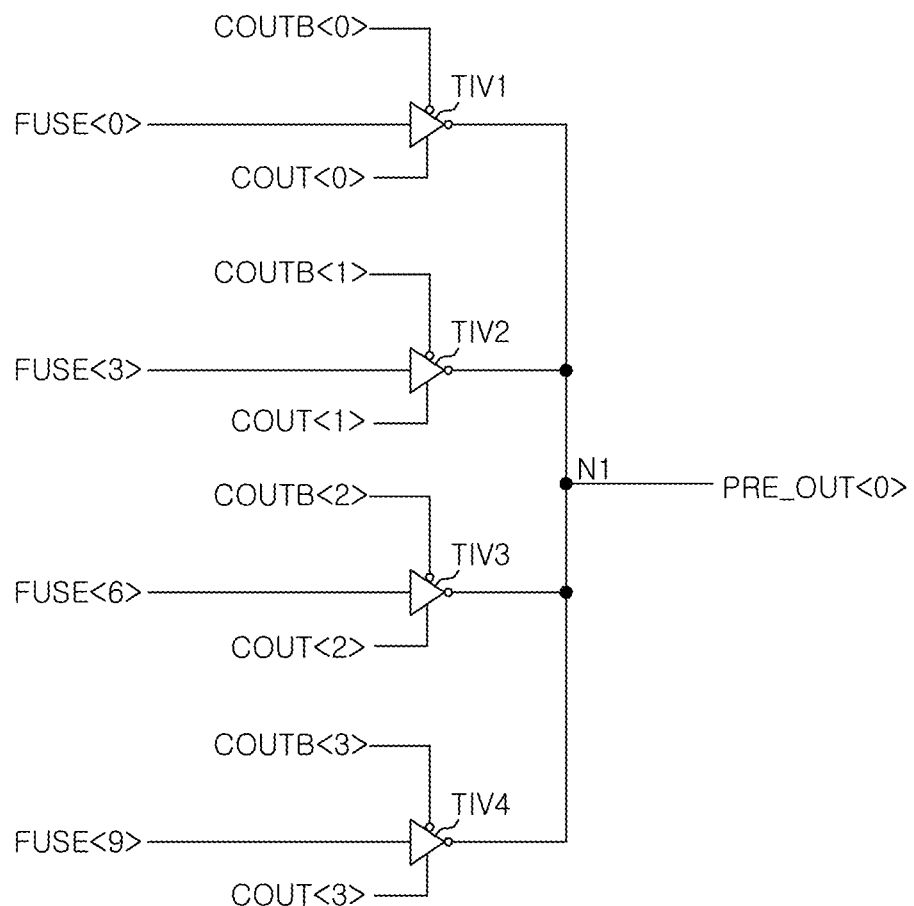
FIG. 6 is a circuit diagram illustrating the configuration of an exemplary embodiment of a first predriver shown in FIG. 5.

FIG. 6 is a circuit diagram illustrating the configuration of an exemplary embodiment of the first predriver shown in FIG. 5. The first predriver 511 includes first to fourth tri-state inverters TIV1 to TIV4 and a driving node N1. The first tri-state inverter TIV1 inverts the fuse signal FUSE<0> under the control of the transmission control signals COUT<0> and COUTB<0>, and outputs the resultant signal to the driving node N1 or interrupts the output of the resultant signal to the driving node N1. The second tri-state inverter TIV2 inverts the fuse signal FUSE<3> under the control of the transmission control signals COUT<1> and COUTB<1>, and outputs the resultant signal to the driving node N1 or interrupts the output of the resultant signal to the driving node N1. Similarly, the third and fourth tri-state inverters TIV3 and TIV4 invert the fuse signals FUSE<6, 9> under the control of the transmission control signals COUT<2:3> and COUTB<2:3>, and output the resultant signals to the driving node N1 or interrupt the output of the resultant signals to the driving node N1. Accordingly, the first predriver 511 inversely drives the fuse signal FUSE<0> when the transmission control signals COUT<0> and COUTB<0> are enabled, and generates the first driving fuse signal PRE_OUT<0>. Similarly, the first predriver 511 inversely drives the fuse signals FUSE<3, 6, 9> when the transmission control signals COUT<1:3> and COUTB<1:3> are enabled, and generates the first driving fuse signal PRE_OUT<0>. Because the second and third predrivers 512 and 513 may be configured in the same manner as the first predriver 511, additional explanations therefor will be omitted therein.

Figure 7:
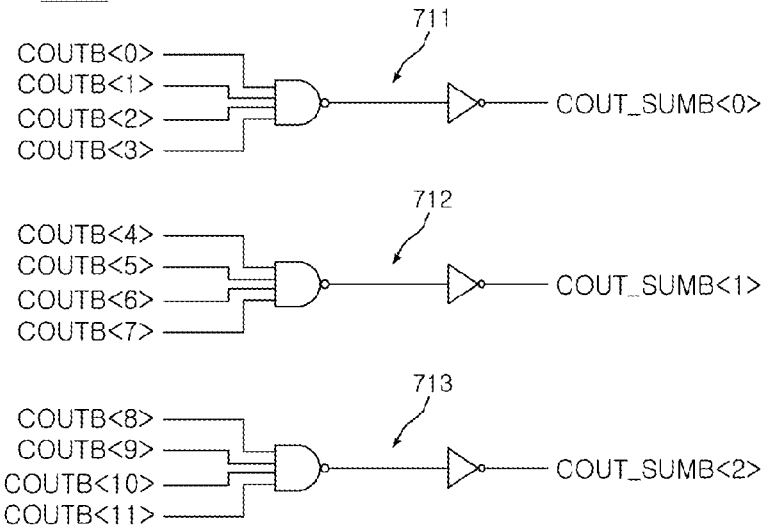
FIG. 7 is a circuit diagram illustrating the configuration of an exemplary embodiment of an output enable signal generation part shown in FIG. 5.

FIG. 7 is a circuit diagram illustrating the configuration of an exemplary embodiment of the output enable signal generation part shown in FIG. 5. In FIG. 7, the output enable signal generation part 520 includes first to third AND gates 711, 712 and 713. The first AND gate 711 receives the inverted signals COUTB<0:3> of the transmission control signals and generates the inverted signal COUT_SUMB<0> of the first output enable signal. The first AND gate 711 generates the inverted signal COUT_SUMB<0> of the first output enable signal, which is consecutively enabled to a low level while the inverted signals COUTB<0:3> of the transmission control signals are sequentially enabled to a low level. The second AND gate 712 receives the inverted signals COUTB<4:7> of the transmission control signals and generates the inverted signal COUT_SUMB<1> of the second output enable signal. The second AND gate 712 generates the inverted signal COUT_SUMB<1> of the second output enable signal, which is consecutively enabled to a low level while the inverted signals COUTB<4:7> of the transmission control signals are sequentially enabled to a low level. The third AND gate 713 receives the inverted signals COUTB<8:11> of the transmission control signals and generates the inverted signal COUT_SUMB<2> of the third output enable signal. The third AND gate 713 generates the inverted signal COUT_SUMB<2> of the third output enable signal, which is consecutively enabled to a low level while the inverted signals COUTB<8:11> of the transmission control signals are sequentially enabled to a low level. It is apparent that the first to third output enable signals COUT_SUM<0:2> may be generated by inverting the inverted signals COUT_SUMB<0:2> of the first to third output enable signals COUT_SUM<0:2>. Therefore, the enable periods of the first to third output enable signals COUT_SUM<0:2> and COUT_SUMB<0:2> do not overlap with one another.

Figure 8:
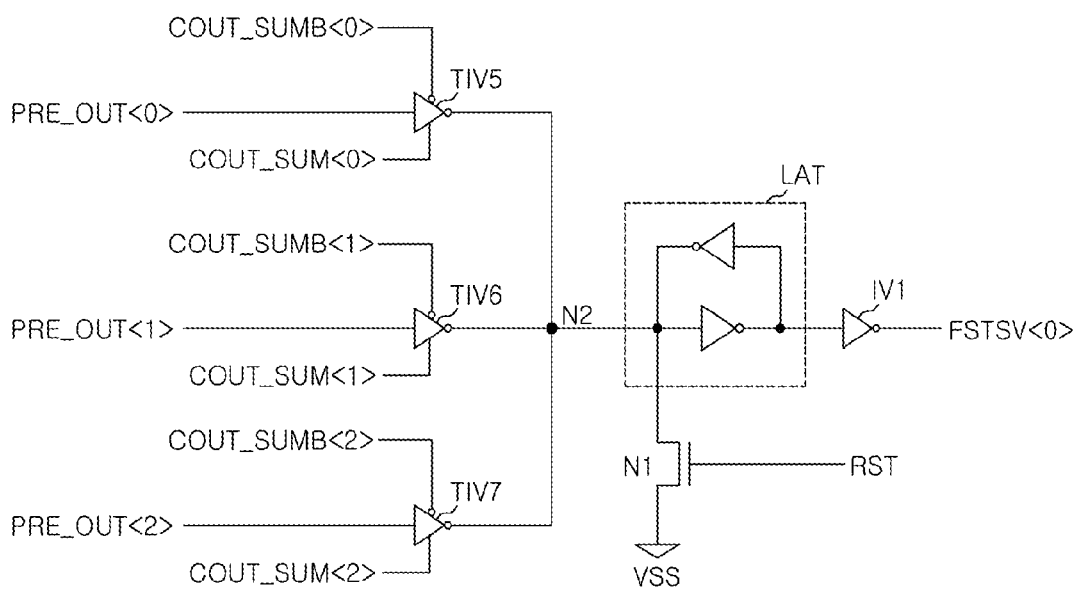
FIG. 8 is a circuit diagram illustrating the configuration of an exemplary embodiment of an output driver shown in FIG. 5.

FIG. 8 is a circuit diagram illustrating the configuration of an exemplary embodiment of the output driver shown in FIG. 5. In FIG. 8, the output driver 530 includes fifth to seventh tri-state inverters TIV5 to TIV7, a latch LAT, first and second inverters IV1, and an NMOS transistor N1. The fifth tri-state inverter TIV5 allows or interrupts the transmission of the first driving fuse signal PRE_OUT<0> outputted from the first predriver 511, under the control of the first output enable signal and the inverted signal thereof COUT_SUM<0> and COUT_SUMB<0>. The sixth tri-state inverter TIV6 allows or interrupts the transmission of the second driving fuse signal PRE_OUT<1> outputted from the second predriver 512, under the control of the second output enable signal and the inverted signal thereof COUT_SUM<1> and COUT_SUMB<1>. The seventh tri-state inverter TIV7 allows or interrupts the transmission of the third driving fuse signal PRE_OUT<2> outputted from the third predriver 513, under the control of the third output enable signal and the inverted signal thereof COUT_SUM<2> and COUT_SUMB<2>. The output terminals of the fifth to seventh tri-state inverters TIV5 to TIV7 are commonly connected to a node N2. The latch LAT latches the voltage level of the node N2 and outputs a signal generated by inverting the voltage of the node N2. Accordingly, the output driver 530 may generate the fuse transmission signal FSTSV<0> from the first driving fuse signal PRE_OUT<0> while the first output enable signals COUT_SUM<0> and COUT_SUMB<0> are enabled, generate the fuse transmission signal FSTSV<0> from the second driving fuse signal PRE_OUT<1> while the second output enable signals COUT_SUM<1> and COUT_SUMB<1> are enabled, and generate the fuse transmission signal FSTSV<0> from the third driving fuse signal PRE_OUT<2> while the third output enable signals COUT_SUM<2> and COUT_SUMB<2> are enabled. Therefore, the first to third driving fuse signals PRE_OUT<0:2> may be outputted sequentially through the output driver 530 without colliding with one another.

The first inverter IV1 inverts the output of the latch LAT and generates the fuse transmission signal FSTSV<0>. The second inverter IV2 receives the reset signal RST. The NMOS transistor N1 receives the reset signal RST and resets the node N2 to a ground voltage level. Therefore, the output driver 530 may be initialized in response to the reset signal RST.

As described above, the second and third transmission sections 420 and 430 have the same configuration as the first transmission section 410 described above with reference to FIGS. 5 to 8. Therefore, the fuse transmission signals FSTSV<0:2> may be generated by the first to third transmission sections 410 to 430 while the first to third output enable signals COUT_SUM<0:2> and COUT_SUMB<0:2> are enabled. Also, as a matter of course, the output enable signal generation part 520 may in some cases not be provided to each of the first to third transmission sections 410 to 430 but be provided only to one transmission section and the remaining transmission sections may commonly receive and use the output enable signals COUT_SUM<0:2> and COUT_SUMB<0:2> generated from the output enable signal generation part 520.

Figure 9:
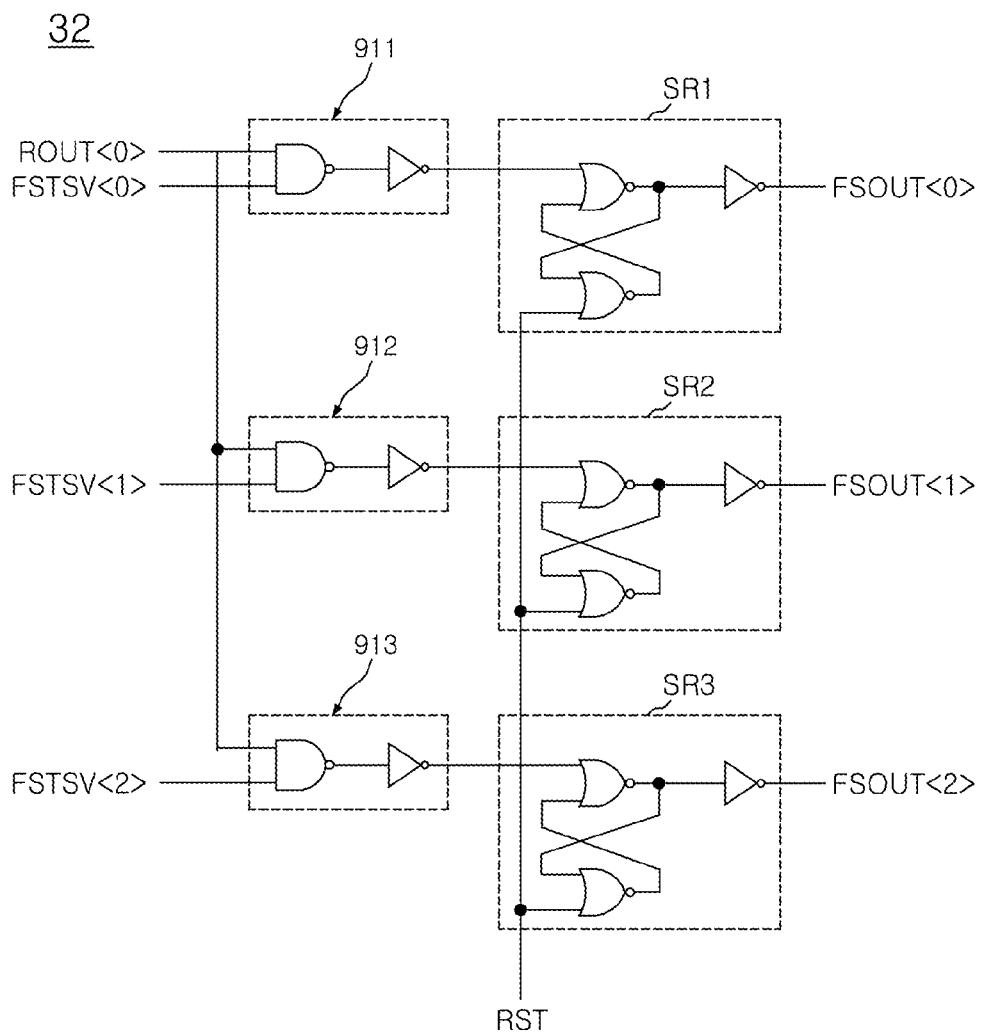
FIG. 9 is a circuit diagram illustrating the configuration of an exemplary embodiment of a fuse signal reception unit shown in FIG. 1.

FIG. 9 is a circuit diagram illustrating the configuration of an exemplary embodiment of the fuse signal reception unit of the signal reception block disposed in the first slave chip slave1 in FIG. 1. In FIG. 9, the fuse signal reception unit 32 includes fourth to sixth AND gates 911, 912 and 913, and first to third SR latch sections SR1 to SR3. The fourth AND gate 911 receives the reception control signal ROUT<0> and the fuse transmission signal FSTSV<0>. The first SR latch section SR1 enables the fuse output signal FSOUT<0> to a high level when the output of the fourth AND gate 911 is enabled to a high level, and disables the fuse output signal FSOUT<0> to a low level in response to the reset signal RST. The fifth AND gate 912 receives the reception control signal ROUT<0> and the fuse transmission signal FSTSV<1>. The second SR latch section SR2 enables the fuse output signal FSOUT<1> to a high level when the output of the fifth AND gate 912 is enabled to a high level, and disables the fuse output signal FSOUT<1> to a low level in response to the reset signal RST. The sixth AND gate 913 receives the reception control signal ROUT<0> and the fuse transmission signal FSTSV<2>. The third SR latch section SR3 enables the fuse output signal FSOUT<2> to a high level when the output of the sixth AND gate 913 is enabled to a high level, and disables the fuse output signal FSOUT<2> to a low level in response to the reset signal RST. This configuration of the fuse signal reception unit 32 may be provided by the same number as the number of the reception control signals ROUT<0:11>. Accordingly, the fuse output signals FSOUT<0:n> to be outputted in parallel may be generated from the fuse transmission signals FSTSV<0:2>, which are inputted in series from the fuse signal reception unit 32. The fuse signal reception unit 32 may receive the fuse transmission signals FSTSV<0:2> transmitted from the signal transmission block 10 in synchronization with the enable timings of the reception control signals ROUT<0:11>, and may generate the fuse output signals FSOUT<0:n> from the received fuse transmission signals FSTSV<0:2>. As a result, the signal transmission block 10 may transmit the thirty-six fuse information exemplified above in synchronization with the transmission control signals COUT<0:11> and COUTB<0:11>, and the signal reception block 30 may receive the thirty-six fuse information in synchronization with the reception control signals ROUT<0:11>, which have substantially the same phases as the transmission control signals COUT<0:11>. Thus, the fuse information transmitted from the master chip master may be precisely transferred at the same time to the master chip master and the first and second slave chips slave1 and slave2.

Figure 10:
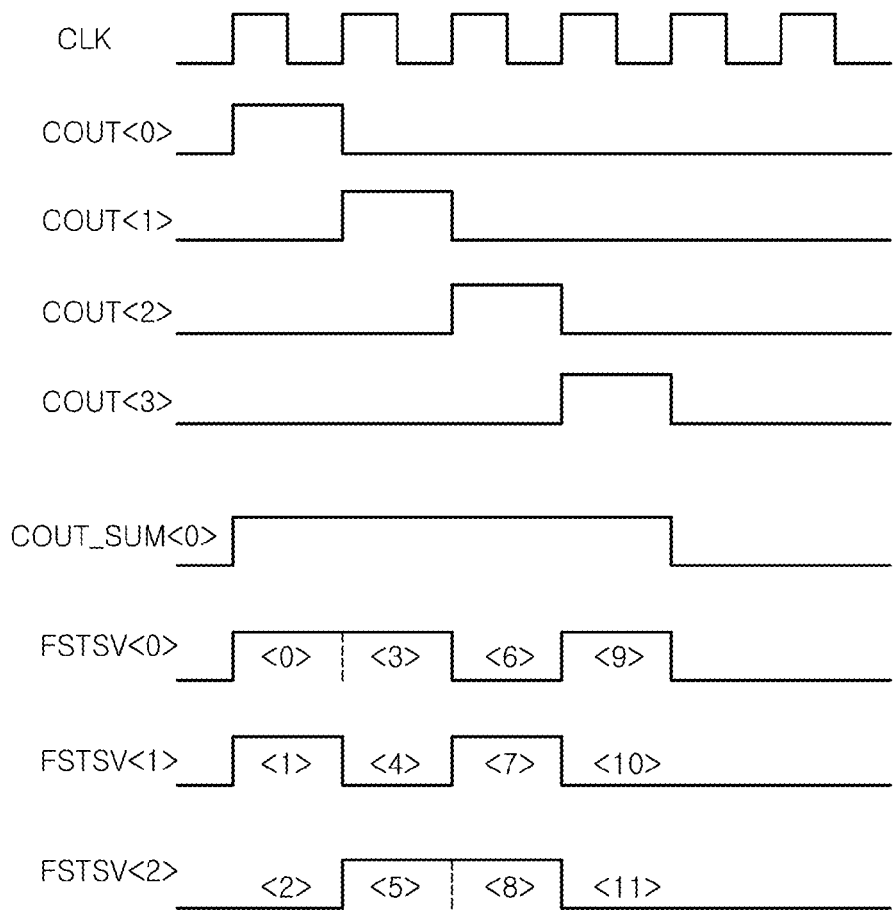
FIG. 10 is a timing diagram illustrating operations of the semiconductor apparatus in accordance with the embodiment of the present invention.

FIG. 10 is a timing diagram illustrating operations of the semiconductor apparatus in accordance with the embodiment of the present invention. Operations of the semiconductor apparatus 1 in accordance with the embodiment of the present invention will be described below with reference to FIGS. 1 to 10. The transmission control signal generation unit 11 receives the clock signal CLK and generates the transmission control signals COUT<0:11> and COUTB<0:11>. The reception control signal generation unit 21 of the master chip master also receives the clock signal CLK and generates the reception control signals ROUT<0:11>, which have substantially the same phases as the transmission control signals COUT<0:11>. The reception control signal generation units 31 and 41 of the first and second slave chips slave1 and slave2 receive the clock signal CLK transmitted through the second TSV TSV2 and generate the reception control signals ROUT<0:11>. The fuse signal transmission unit 12 generates the fuse transmission signals FSTSV<0:2> from the fuse signals FUSE<0:n> with the fuse information of fuse circuit 13 according to the transmission control signals COUT<0: 11> and COUTB<0:11>, and transmits the generated fuse transmission signals FSTSV<0:2> through the first TSV TSV1. In FIG. 10, the fuse transmission signals FSTSV<0:2> generated from the first to third transmission sections 410, 420 and 430 are outputted in response to the first output enable signal COUT_SUM<0>, which is consecutively enabled while the transmission control signals COUT<0:11> are sequentially enabled. The fuse transmission signal FSTSV<0> sequentially outputs the fuse information of the fuse signals FUSE<0, 3, 6, 9>, the fuse transmission signal FSTSV<1> sequentially outputs the fuse information of the fuse signals FUSE<1, 4, 7, 10>, and the fuse transmission signal FSTSV<2> sequentially outputs the fuse information of the fuse signals <2, 5, 8, 11>. The fuse signal reception units 22, 32 and 42 may receive the fuse transmission signals FSTSV<0:2> in synchronization with the reception control signals ROUT<0:11> and generate the fuse output signals FSOUT<0:n>.

Figure 11:
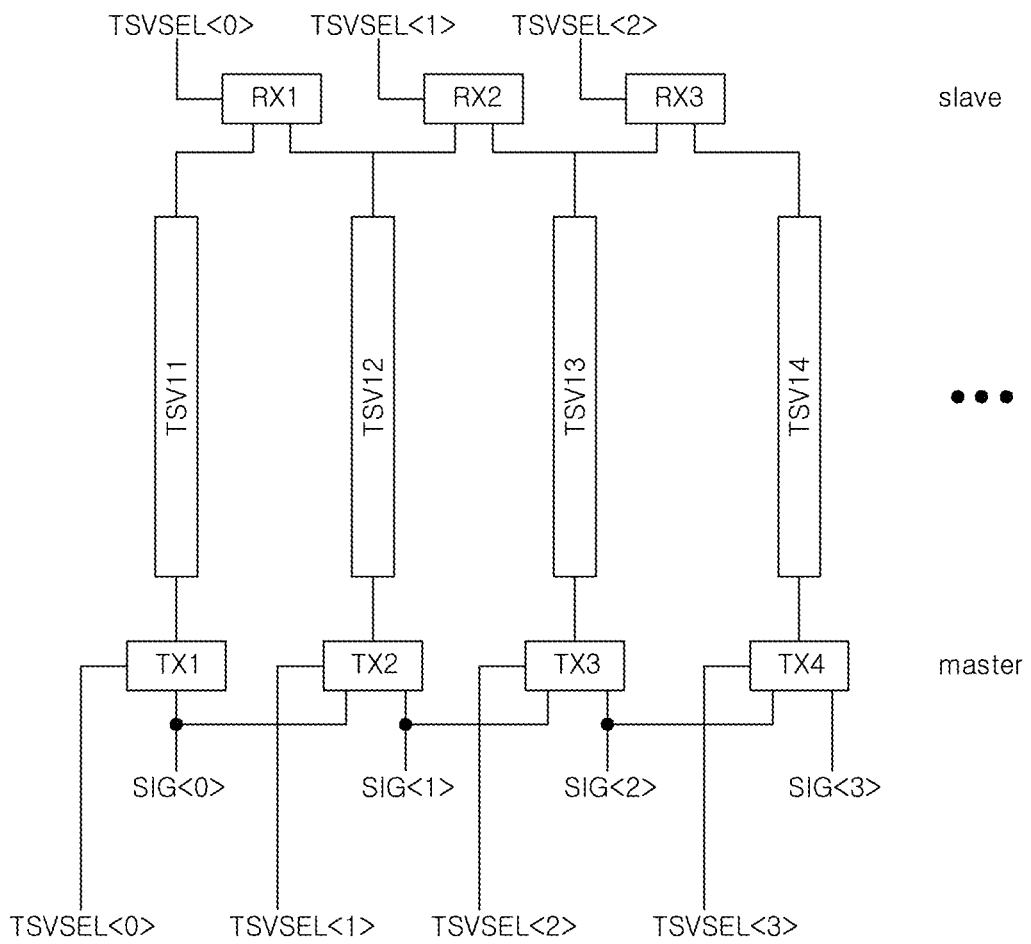
FIG. 11 is a diagram schematically illustrating the configuration of an exemplary embodiment of a repair circuit in which the fuse information transmitted by the semiconductor apparatus in accordance with the embodiment of the present invention may be used.

FIG. 11 is a diagram schematically illustrating the configuration of an exemplary embodiment of a repair circuit 50 in which the fuse information transmitted by the semiconductor apparatus 1 in accordance with the embodiment of the present invention may be used. As described above, the TSV selection units 23, 33 and 43 decode the fuse output signals FSOUT<0: n> generated by the signal reception blocks 20, 30 and 40 and generate the TSV selection signals TSVSEL<0:m>. For the purpose of exemplification, FIG. 11 illustrates a case where one master chip master and one slave chip slave are electrically connected with each other through four TSVs. A first TSV TSV11 transmits a first signal SIG<0> from the master chip master to the slave chip slave. Second to fourth TSVs TSV12 to TSV14 transmit second to fourth signals SIG<1:3> from the master chip master to the slave chip slave. The first to fourth TSVs TSV11 to TSV14 are connected to a plurality of transceivers TX1 to TX4 and receivers RX1 to RX3. That is to say, the transceivers TX1 to TX4 may receive together signals to be transmitted through assigned TSVs and adjacent TSVs, and may select TSVs through which the signals are to be transmitted, according to the TSV selection signals TSVSEL<0:3>. Similarly, the receivers RX1 to RX3 are connected to assigned TSVs and adjacent TSVs, and may receive the signals transmitted from ones of the assigned TSVs and the adjacent TSVs according to the TSV selection signals TSVSEL<0:2>. Accordingly, TSVs through which the signals are to be transmitted may be selected according to the TSV selection signals TSVSEL<0:m>.

When assuming that the first, third and fourth TSVs TSV11, TSV13 and TSV14 are normal and the second TSV TSV12 are defective, in order for precise signal transmission, the second signal SIG<1> should not be transmitted through the second TSV TSV12 and should be transmitted through a normal TSV. Thus, a repair process is required. At this time, such repair information is outputted from the fuse circuit 13 of FIG. 1 as fuse information. The signal reception blocks 20, 30 and 40 receive the fuse information and generate the TSV selection signals TSVSEL<0:m>. The TSV selection signals TSVSEL<0:m> generated in the master chip master may be inputted to the transceivers TX1 to TX4 of FIG. 11, and the TSV selection signals TSVSEL<0:m> generated in the slave chip slave may be inputted to the receivers RX1 to RX3 of FIG. 11. The transceiver TX1 may transmit the first signal SIG<0> through the first TSV TSV11 in response to the TSV selection signal TSVSEL<0>, and the receiver RX1 may receive the first signal SIG<0> through the first TSV TSV11 in response to the TSV selection signal TSVSEL<0>. The transceivers TX2 and TX3 may transmit the second signal SIG<1> not through the second TSV TSV12 but through the third TSV TSV13 in response to the TSV selection signals TSVSEL<1:2>, and the receiver RX2 may receive the second signal SIG<1> through the third TSV TSV13 in response to the TSV selection signal TSVSEL<1>. Similarly, the transceivers TX3 and TX4 may transmit the third signal SIG<2> through the fourth TSV TSV14, and the receiver RX3 may receive the third signal SIG<2> through the fourth TSV TSV14. Accordingly, the TSV selection signals TSVSEL<0: m> are inputted to the repair circuit 50 to detour a transmission path for a signal, which is otherwise to be transmitted through a defective TSV, to a normal TSV, so that normal transmission of the signal can be made possible.

As described above, the transmission control signals COUT<0:11> generated by the shift register section 120 shown in FIGS. 2 and 3 are signals that are consecutively and sequentially enabled. Accordingly, every time the transmission control signals COUT<0:11> are enabled, the fuse information may be transmitted from the master chip master to the slave chips slave1 and slave2. However, where the fuse information is transmitted by the transmission control signals COUT<0:11>, which are consecutively and sequentially enabled, normal signal transmission may fail. That is to say, generation timings of the transmission control signals COUT<0:11> may not precisely match the reception control signals ROUT<0:11> generated in the signal reception blocks 30 and 40. Because the signal transmission block 10 of the master chip master and the signal reception blocks 30 and 40 of the slave chips slave1 and slave2 are disposed at a distance and the clock signal CLK is transmitted from the master chip master through the TSV to the slave chips slave1 and slave2, a skew may occur between the generation timings of the transmission control signals COUT<0:11> and the generation timings of the reception control signals ROUT<0: 11>.

Figure 12:
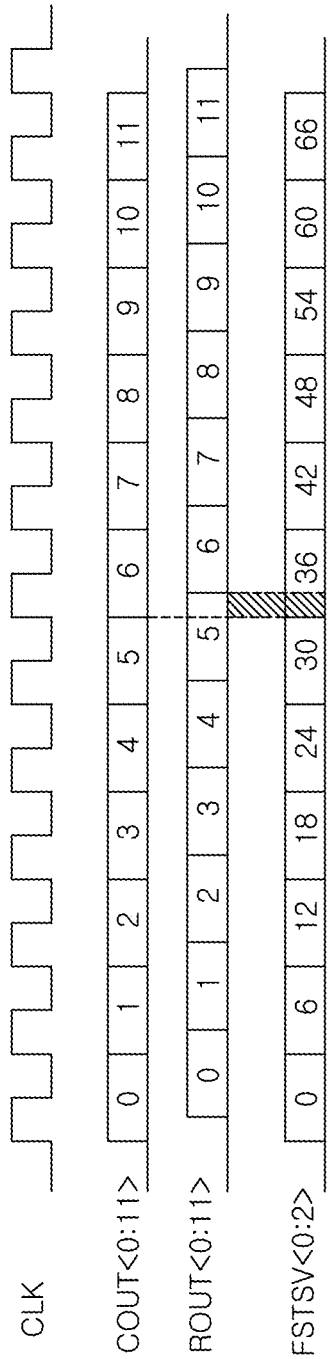
FIG. 12 is a timing diagram exemplifying a case in which transmission of fuse information fails due to consecutive transmission of fuse information.

FIG. 12 is a timing diagram exemplifying a case in which transmission of fuse information fails due to consecutive transmission of fuse information. As can be seen from FIG. 12, due to the fact that the generation timings of the transmission control signals COUT<0:11> generated by the signal transmission block 10 of the master chip master and the generation timings of the reception control signals ROUT<0: 11> generated by the signal reception blocks 30 and 40 of the slave chips slave1 and slave2 do not match each other, a case may occur in which fuse information is erroneously transmitted. For the sake of convenience of explanation, the respective bits of the transmission control signals COUT<0:11> are sequentially numbered as 0 to 11, and the respective bits of the reception control signals ROUT<0:11> are sequentially numbered as 0 to 11. The fuse information of the fuse transmission signals FSTSV<0:2> transmitted in synchronization with the transmission control signals COUT<0:11> are numbered 0, 6, 12, . . . , 66. As described above, the reception control signals ROUT<0:11> may be generated by being delayed more than the transmission control signals COUT<0: 11>. The signal transmission block 10 transmits the fuse transmission signals FSTSV<0:2> with the fuse information of 0 when the first bit COUT<0> of the transmission control signals COUT<0:11> is enabled, and the signal reception blocks 30 and 40 receive the fuse transmission signals FSTSV<0:2> with the fuse information of 0 when the first bit ROUT<0> of the reception control signals ROUT<0:11> is enabled. However, as the generation timings of the reception control signals ROUT<0:11> are delayed, while the sixth bit ROUT<5> of the reception control signals ROUT<0:11> is enabled, the signal reception blocks 30 and 40 initially receive the fuse transmission signals FSTSV<0:2> with the fuse information of 30 and then receive the fuse transmission signals FSTSV<0:2> with the fuse information of 36. Accordingly, although the signal transmission block 10 transmits the fuse transmission signals FSTSV<0:2> with the fuse information of 30 in synchronization with the sixth bit COUT<5> of the transmission control signals COUT<0:11>, the signal reception blocks 30 and 40 receive the fuse transmission signals FSTSV<0:2> with the fuse information of 36, which is transmitted in synchronization with the seventh bit COUT<6> of the transmission control signals COUT<0:11>. Therefore, the signal reception blocks 30 and 40 may receive erroneous fuse information in synchronization with the sixth bit ROUT<5> of the reception control signals ROUT<0:11>. Thus, another embodiment of the present invention may be provided to solve this problem. Another embodiment of the present invention is configured in such a manner that the fuse information is not consecutively and sequentially transmitted but is sequentially transmitted with a preset time interval. That is to say, another embodiment of the present invention is configured to discretely generate the transmission control signals.

Figure 13:
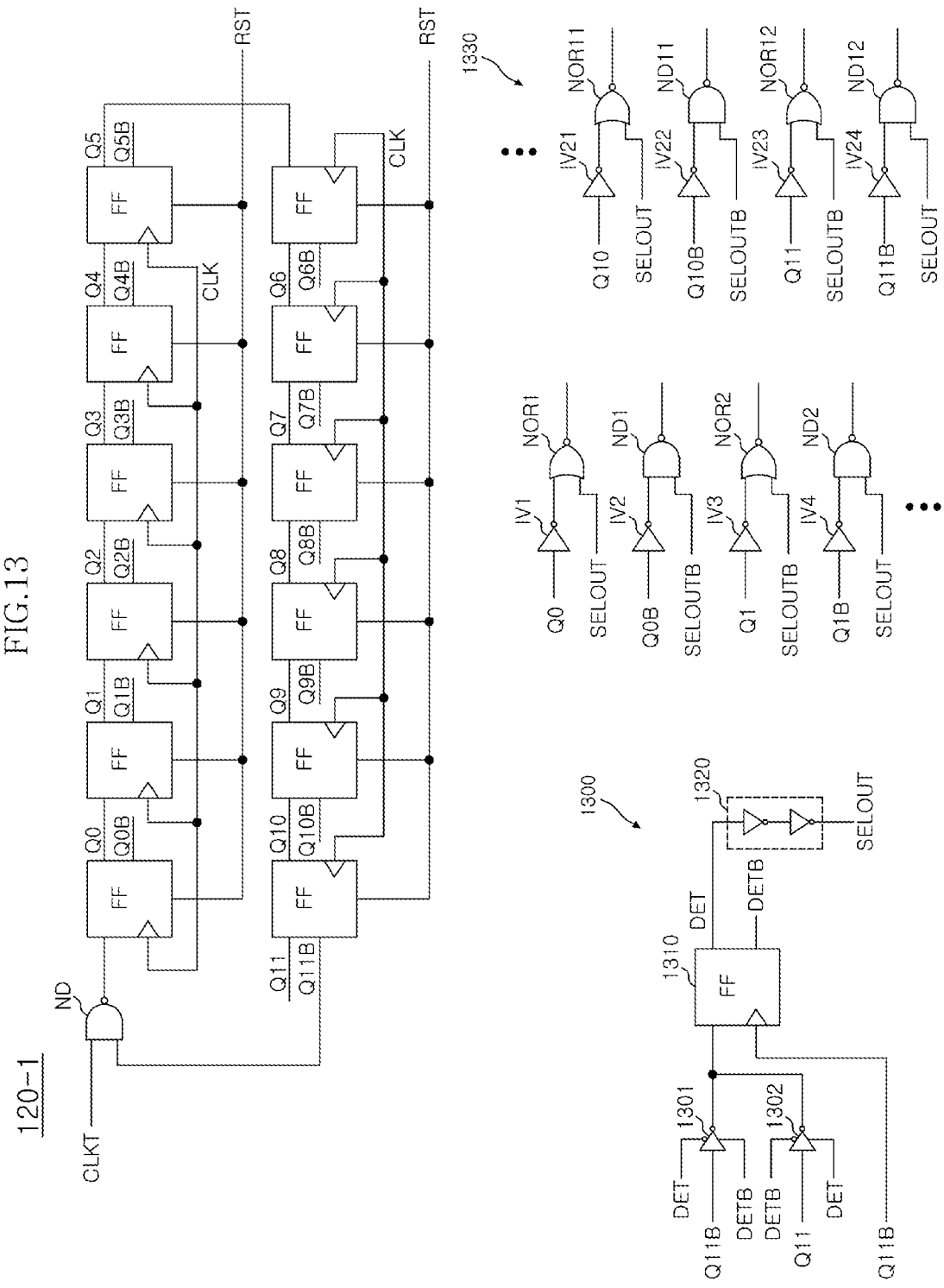
FIG. 13 is a diagram schematically illustrating the configuration of another exemplary embodiment of a shift register of a semiconductor apparatus in accordance with another embodiment of the present invention.

FIG. 13 is a diagram schematically illustrating the configuration of another exemplary embodiment of a shift register of a semiconductor apparatus in accordance with another embodiment of the present invention. In FIG. 13, a shift register section 120-1 includes an output selection signal generation part 1300 in addition to the configuration of the shift register section 120 shown in FIG. 3, and the plurality of buffer parts are replaced with control buffer parts. The output selection signal generation part 1300 receives a final output Q11 of the flip-flops FF and generates an output selection signal SELOUT.

In FIG. 13, the output selection signal generation part 1300 selectively delays the output Q11 of the final flip-flop FF and an inverted signal Q11B thereof in response to a detection signal DET, and generates the output selection signal SELOUT from the delayed signal.

In FIG. 13, the output selection signal generation part 1300 tri-state inverters 1301 and 1302, a flip-flop 1310, and a buffer part 1320. The tri-state inverter 1301 inverts and outputs the inverted signal Q11B of the output Q11 of the final flip-flop FF under the control of the detection signal DET and an inverted signal DETB thereof. The tri-state inverter 1302 inverts and outputs the output Q11 of the final flip-flop FF under the control of the detection signal DET and the inverted signal DETB thereof. The flip-flop 1310 delays the outputs of the tri-state inverters 1301 and 1302 in synchronization with the inverted signal Q11B of the output Q11 of the final flip-flop FF, and generates the detection signals DET and DETB. The buffer part 1320 buffers the detection signal DET and generates the output selection signal SELOUT. If the detection signal DET is initially set to a low level and the inverted signal Q11B of the output Q11 of the final flip-flop FF is set to a high level, the output selection signal generation part 1300 receives the inverted signal Q11B of the output Q11 of the final flip-flop FF and generates the output selection signal SELOUT at a low level. Thereafter, if the flip-flop chain is circulated one turn, as the inverted signal Q11B of the output Q11 of the final flip-flop FF is received, the output selection signal SELOUT becomes a high level by the tri-state inverter 1301, which is activated by the detection signal DET of a low level. Thereafter, if the flip-flop chain is circulated another one turn, the output Q11 of the final flip-flop FF becomes a high level, and the output selection signal SELOUT becomes a low level by the tri-state inverter 1302, which is activated by the detection signal DET of a high level. In this way, the shift register section 120-1 in accordance with another embodiment of the present invention may generate the output selection signal SELOUT having a logic level alternating between a high level and a low level each time the flip-flop chain is circulated one turn.

In FIG. 13, the control buffer part 1330 includes first to twenty fourth inverters IV1 to IV24, first to twelfth NOR gates NOR1 to NOR12, and first to twelfth NAND gates ND1 to ND12. The first to twenty fourth inverters IV1 to IV24 respectively invert the outputs Q0 to Q11 and Q0B to Q11B of the flip-flops FF. The first, third, fifth, seventh, ninth and eleventh NOR gates NOR1, NOR3, NOR5, NOR7, NOR9 and NOR11 respectively receive the outputs of the first, fifth, ninth, thirteenth, seventeenth and twenty first inverters IV1, IV5, IV9, IV13, IV17 and IV21, and commonly receive the output selection signal SELOUT. The second, fourth, sixth, eighth, tenth and twelfth NOR gates NOR2, NOR4, NOR6, NOR8, NOR10 and NOR12 respectively receive the outputs of the third, seventh, eleventh, fifteenth, nineteenth and twenty third inverters IV3, IV7, IV11, IV15, IV19 and IV23, and commonly receive an output selection signal SELOUTB. The first, third, fifth, seventh, ninth and eleventh NAND gates ND1, ND3, ND5, ND7, ND9 and ND11 respectively receive the outputs of the second, sixth, tenth, fourteenth, eighteenth and twenty second inverters IV2, IV6, IV10, IV14, IV18 and IV22, and commonly receive the output selection signal SELOUTB. The second, fourth, sixth, eighth, tenth and twelfth NAND gates ND2, ND4, ND6, NDB, ND10 and ND12 respectively receive the outputs of the fourth, eighth, twelfth, sixteenth, twentieth and twenty fourth inverters IV4, IV8, IV12, IV16, IV20 and IV24, and commonly receive an output selection signal SELOUT. Accordingly, the control buffer part 1330 may provide the transmission control signals COUT<0, 2, 4, 6, 8, 10> by buffering the outputs Q0, Q2, Q4, Q6, Q8 and Q10 of the odd-numbered flip-flops FF when the output selection signal SELOUT has a low level, and may provide the transmission control signals COUT<1, 3, 5, 7, 9, 11> by buffering the outputs Q1, Q3, Q5, Q7, Q9 and Q11 of the even-numbered flip-flops FF when the output selection signal SELOUT has a high level.

Figure 14:
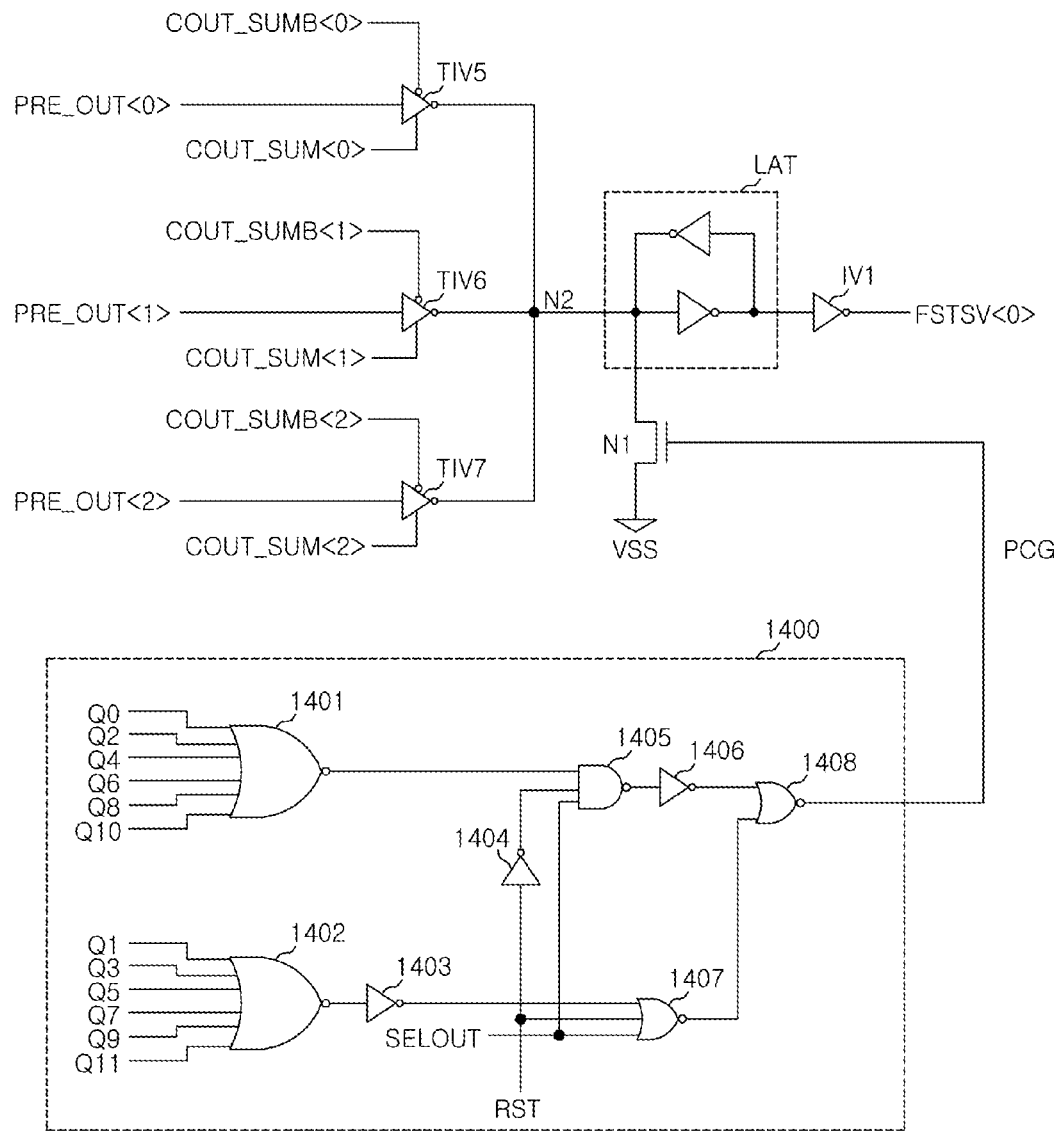
FIG. 14 is a diagram schematically illustrating the configuration of another exemplary embodiment of the output driver of the semiconductor apparatus in accordance with the embodiment of the present invention.

FIG. 14 is a diagram schematically illustrating the configuration of another exemplary embodiment of the output driver of the semiconductor apparatus in accordance with the embodiment of the present invention. In FIG. 14, an output driver 530-1 includes a precharge portion 1400 in addition to the configuration of the output driver 530 shown in FIG. 8. The precharge portion 1400 receives the outputs Q0 to Q11 and Q0B to Q11B of the plurality of flip-flops FF constituting the shift register section 120-1, the output selection signal SELOUT and the reset signal RST, and generates a precharge signal PCG. The precharge signal PCG is inputted to the gate of the NMOS transistor N1, which constitute the output driver 530-1. The precharge portion 1400 generates the precharge signal PCG so as to precharge the voltage level of the node N2 to a predetermined level, for example, the level of a ground voltage VSS between periods during which the driving fuse signals PRE<0, 2> are transmitted by the transmission control signals COUT<0, 2, 6, 8, 10>. Meanwhile, if the reset signal RST is received, the precharge signal PCG is enabled similarly. Therefore, the precharge portion 1400 functions to prevent another driving fuse signal, which is not assigned, from being transmitted when the transmission control signals COUT<0, 2, 6, 8, 10> are inputted.

In FIG. 14, the precharge portion 1400 includes first to fourth NOR gates 1401, 1402, 1407 and 1408, first to third inverters 1403, 1404 and 1406, and a first NAND gate 1405.

The first NOR gate 1401 receives the outputs Q0, Q2, Q4, Q6, Q8 and Q10 of the odd-numbered flip-flops FF. The second NOR gate 1402 receives the outputs Q1, Q3, Q5, Q7, Q9 and Q11 of the even-numbered flip-flops FF. The first inverter 1403 inverts the output of the second NOR gate 1402. The second inverter 1404 inverts the reset signal RST. The first NAND gate 1405 receives the output of the first NOR gate 1401, the output of the second inverter 1404 and the output selection signal SELOUT. The third NOR gate 1407 receives the output of the first inverter 1403, the reset signal RST and the output selection signal SELOUT. The third inverter 1406 inverts the output of the first NAND gate 1405. The fourth NOR gate 1408 receives the outputs of the third inverter 1406 and the third NOR gate 1407 and generates the precharge signal PCG.

Figure 15:
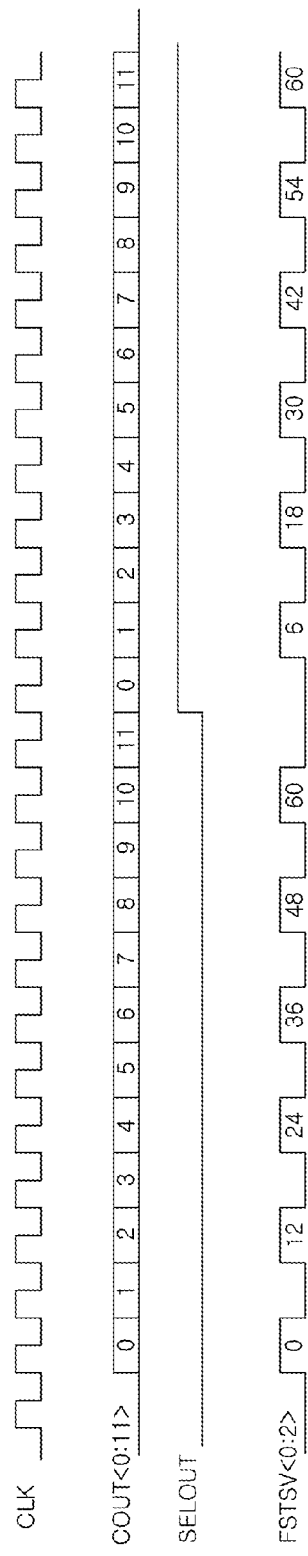
FIG. 15 is a timing diagram illustrating operations of the semiconductor apparatus in accordance with another embodiment of the present invention.

FIG. 15 is a timing diagram illustrating operations of the semiconductor apparatus in accordance with another embodiment of the present invention. In FIG. 15, when the flip-flop chain constituting the shift register section 120-1 is circulated one turn, the output selection signal SELOUT has a low level. Accordingly, the fuse transmission signals FSTSV<0:2> with the fuse information corresponding to 0, 12, 24, 36, 48 and 60 may be transmitted by the transmission control signals COUT<0, 2, 4, 6, 8, 10>. Thereafter, if the output selection signal SELOUT becomes a high level, the fuse transmission signals FSTSV<0:2> with the fuse information corresponding to 6, 18, 30, 42, 54 and 66 may be transmitted by the transmission control signals COUT<1, 3, 5, 7, 9, 11>. Accordingly, in another embodiment of the present invention, because the fuse information is not consecutively transmitted but transmitted with the preset time interval, it is possible to prevent erroneous fuse information from being transmitted as in FIG. 12.

While certain embodiments have been described above, it will be understood to those skilled in the art that the embodiments described are by way of example only. Accordingly, the semiconductor apparatus and the repair method thereof described herein should not be limited based on the described embodiments. Rather, the semiconductor apparatus and the repair method thereof described herein should only be limited in light of the claims that follow when taken in conjunction with the above description and accompanying drawings.

What is claimed is:

1. A semiconductor apparatus in which first and second chips are stacked, comprising:
a signal transmission block disposed in the first chip and configured to transmit fuse information in synchronization with transmission control signals; and
signal reception blocks disposed in the first and second chips, and configured to receive the fuse information in synchronization with reception control signals,
wherein the transmission control signals and the reception control signals have substantially the same phases.

2. The semiconductor apparatus according to claim 1, wherein the signal transmission block comprises:
a transmission control signal generation unit configured to receive a clock signal and generate the transmission control signals; and
a fuse signal transmission unit configured to generate fuse transmission signals from fuse signals in synchronization with the transmission control signals and transmit the generated fuse transmission signals.

3. The semiconductor apparatus according to claim 2, wherein the transmission control signal generation unit comprises:

a pulse generation section configured to receive the clock signal and an enable signal, and generate an initial pulse; and
a shift register section configured to generate the transmission control signals, which are sequentially enabled, by sequentially delaying the initial pulse by a predetermined time in response to the clock signal.

4. The semiconductor apparatus according to claim 2, wherein the fuse signal transmission unit receives the fuse signals, which are inputted in parallel, when the transmission control signals are sequentially enabled, and generates the fuse transmission signals. which are outputted in series.

5. The semiconductor apparatus according to claim 2, wherein the transmission control signal generation unit comprises:
a pulse generation section configured to receive the clock signal and an enable signal, and generate an initial pulse;
a shift register section having a chain of flip-flops, and configured to consecutively generate the transmission control signals, which are sequentially enabled, by sequentially delaying the initial pulse by a predetermined time in response to the clock signal; and
an output selection signal generation part configured to generate an output selection signal, which changes logic states when a loop of the shift register section is circulated.

6. The semiconductor apparatus according to claim 5, wherein the fuse signal transmission unit includes a precharge portion configured to receive the transmission control signals and the output selection signal, and generate a precharge signal, which is enabled with a preset time interval, and precharges the fuse transmission signals to a preselected level in response to the precharge signal.

7. The semiconductor apparatus according to claim 2, wherein the signal reception block comprises:
a reception control signal generation unit configured to receive the clock signal and generate the reception control signals, which have substantially the same phases as the transmission control signals; and
a fuse signal reception unit configured to store the fuse transmission signals in synchronization with the reception control signals and output the stored fuse transmission signals as fuse output signals.

8. The semiconductor apparatus according to claim 7, wherein the reception control signal generation unit comprises:
a pulse generation section configured to generate an initial pulse in response to the clock signal and an enable signal; and
a shift register section configured to generate the reception control signals, which are sequentially enabled, by sequentially delaying the initial pulse by a predetermined time in response to the clock signal.

9. The semiconductor apparatus according to claim 7, wherein the fuse signal reception unit receives the fuse transmission signals, which are inputted in series, when the reception control signals are sequentially enabled, and generates the fuse output signals, which are outputted in parallel.

10. The semiconductor apparatus according to claim 7, further comprising:
a TSV selection unit configured to decode the fuse output signals and generate TSV selection signals.

11. A semiconductor apparatus comprising:
a signal transmission block configured to transmit fuse information in response to transmission control signals;

a master chip signal reception block disposed in a master chip and configured to receive the fuse information in response to reception control signals and generate first TSV selection signals;

a slave chip signal reception block disposed in a slave chip and configured to receive the fuse information in response to the reception control signals and generate second TSV selection signals; and a repair circuit configured to set paths of signals to be transmitted from the master chip to the slave chip, in response to the first and second TSV selection signals.

12. The semiconductor apparatus according to claim 11, wherein the signal transmission block comprises:

a transmission control signal generation unit configured to receive a clock signal and generate the transmission control signals; and a fuse signal transmission unit configured to generate fuse transmission signals from fuse signals in synchronization with the transmission control signals and transmit the generated fuse transmission signals.

13. The semiconductor apparatus according to claim 12, wherein the transmission control signal generation unit comprises:

a pulse generation section configured to generate a pulse signal in response to the clock signal and an enable signal; and a shift register section configured to generate the transmission control signals, which are sequentially enabled, by sequentially delaying the pulse signal by a predetermined time in response to the clock signal.

14. The semiconductor apparatus according to claim 12, wherein the fuse signal transmission unit receives the fuse signals, which are inputted in parallel, when the transmission control signals are sequentially enabled, and generates the fuse transmission signals, which are outputted in series.

15. The semiconductor apparatus according to claim 12, wherein the transmission control signal generation unit comprises:

a pulse generation section configured to receive the clock signal and an enable signal, and generate an initial pulse;

a shift register section having a chain structure of flip-flops, and configured to consecutively generate the transmission control signals, which are sequentially enabled, by sequentially delaying the initial pulse by a predetermined time in response to the clock signal; and an output selection signal generation part configured to generate an output selection signal, which changes logic states when a loop of the shift register section is circulated.

16. The semiconductor apparatus according to claim 15, wherein the fuse signal transmission unit includes a precharge portion configured to receive the transmission control signals and the output selection signal, and generate a precharge signal, which is enabled with a preset time interval, and precharges the fuse transmission signals to a preselected level in response to the precharge signal.

17. The semiconductor apparatus according to claim 12, wherein the master chip signal reception block comprises:

a reception control signal generation unit configured to generate the reception control signals in response to the clock signal;

a fuse signal reception unit configured to store the fuse transmission signals in synchronization with the reception control signals and output the stored fuse transmission signals as fuse output signals; and a TSV selection unit configured to decode the fuse output signals and generate the first TSV selection signals.

18. The semiconductor apparatus according to claim 17, wherein the reception control signals have substantially the same phases as the transmission control signals.

19. The semiconductor apparatus according to claim 17, wherein the reception control signal generation unit comprises:

a pulse generation section configured to generate a pulse signal in response to the clock signal and an enable signal; and a shift register section configured to generate the reception control signals, which are sequentially enabled, by sequentially delaying the pulse signal by a predetermined time in response to the clock signal.

20. The semiconductor apparatus according to claim 17, wherein the fuse signal reception unit receives the fuse transmission signals, which are inputted in series, every time the reception control signals are sequentially enabled, and generates the fuse output signals, which are outputted in parallel.

21. The semiconductor apparatus according to claim 12, wherein the slave chip signal reception block comprises:

a reception control signal generation unit configured to generate the reception control signals in response to the clock signal;

a fuse signal reception unit configured to store the fuse transmission signals in synchronization with the reception control signals and output the stored fuse transmission signals as fuse output signals; and a TSV selection unit configured to decode the fuse output signals and generate the second TSV selection signals.

22. The semiconductor apparatus according to claim 21, wherein the reception control signals have substantially the same phases as the transmission control signals.

23. The semiconductor apparatus according to claim 21, wherein the reception control signal generation unit comprises:

a pulse generation section configured to generate a pulse signal in response to the clock signal and an enable signal; and a shift register section configured to generate the reception control signals, which are sequentially enabled, by sequentially delaying the pulse signal by a predetermined time in response to the clock signal.

24. The semiconductor apparatus according to claim 21, wherein the fuse signal reception unit receives the fuse transmission signals, which are inputted in series, every time the reception control signals are sequentially enabled, and generates the fuse output signals, which are outputted in parallel.

25. The semiconductor apparatus according to claim 11, wherein the repair circuit comprises:

first and second TSVs configured to transmit a first signal;

a transceiver configured to output the first signal to any one of the first and second TSVs in response to the first TSV selection signals; and a receiver configured to receive the first signal through one of the first and second TSVs in response to the second TSV selection signals.

26. A method for repairing a semiconductor apparatus, comprising:

receiving a clock signal and generating transmission control signals and reception control signals;

transmitting fuse information from a master chip in response to the transmission control signals;

receiving the fuse information in response to the reception control signals in the master chip and a slave chip; and selecting a TSV for transmitting a signal from the master chip to the slave chip, in response to the fuse information.

27. The method according to claim 26, wherein the transmission control signals are generated in the master chip, and the reception control signals are generated in the master chip and the slave chip.

28. The method according to claim 26, wherein the transmission control signals and the reception control signals have substantially the same phases.

29. The method according to claim 26, wherein generating the transmission control signals and the reception control signals comprises:
  generating a pulse signal from the clock signal and an enable signal; and
  generating the transmission control signals, which are sequentially enabled, and the reception control signals, which are sequentially enabled, by sequentially delaying the pulse signal by a predetermined time in response to the clock signal.

30. The method according to claim 29, wherein, in transmitting the fuse information, the fuse information is transmitted in synchronization with the transmission control signals when the transmission control signals are enabled.

31. The method according to claim 30, wherein, in receiving the fuse information, the fuse information is received in synchronization with the reception control signals when the reception control signals are enabled.

32. The method according to claim 26, wherein selecting the TSV comprises:
  decoding the received fuse information and generating the TSV selection signals; and
  setting the TSV for transmitting the signal, in response to the TSV selection signals.

33. A method for repairing a semiconductor apparatus, comprising:
  receiving a clock signal and generating transmission control signals and reception control signals;
  generating output enable signals, which are enabled with a preset time interval, from the transmission control signals;
  transmitting fuse information from a master chip in response to the output enable signals; and
  receiving the fuse information by the master chip and a slave chip in response to the reception control signals.

34. The method according to claim 33, wherein the transmission control signals are generated in the master chip, and the reception control signals are generated in the master chip and the slave chip.

35. The method according to claim 34, wherein the output enable signals are generated in the master chip.

36. The method according to claim 33, wherein the transmission control signals have substantially the same phases as the reception control signals.

37. The method according to claim 33, wherein generating the transmission control signals and the reception control signals comprises:
  generating a pulse signal from the clock signal and an enable signal; and
  generating the transmission control signals, which are sequentially enabled, and the reception control signals, which are sequentially enabled, by sequentially delaying the pulse signal by a predetermined time in response to the clock signal.

38. The method according to claim 33, wherein, in transmitting the fuse information, the fuse information is transmitted in synchronization with the output enable signals when the output enable signals are enabled.

39. The method according to claim 38, wherein, in receiving the fuse information, the fuse information is received in synchronization with the reception control signals when the reception control signals are enabled.

40. The method according to claim 33, further comprising:
  decoding the received fuse information and generate TSV selection signals; and
  setting a TSV for transmitting a signal from the master chip to the slave chip, in response to the TSV selection signals.

* * * * *